(12) United States Patent
Chan et al.

(10) Patent No.: US 6,812,077 B1
(45) Date of Patent: Nov. 2, 2004

(54) METHOD FOR PATTERNING NARROW GATE LINES

(75) Inventors: Darin Chan, Campbell, CA (US); Douglas J. Bonser, Austin, TX (US); Mark S. Chang, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/299,433

(22) Filed: Nov. 19, 2002

(51) Int. Cl.[7] .................. H01L 21/00; H01L 21/84; H01L 21/337; H01L 21/3205; H01L 21/4763

(52) U.S. Cl. .................. 438/163; 438/165; 438/188; 438/595

(58) Field of Search .................. 438/163, 165, 438/188, 595, 596

(56) References Cited

U.S. PATENT DOCUMENTS 5,856,227 A * 1/1999 Yu et al. .................. 438/305

FOREIGN PATENT DOCUMENTS

JP 2000-236091 * 8/2000 .......... H01L/29/78

OTHER PUBLICATIONS

Stanley Wolf Ph.D. and Richard N. Tauber Ph.D. in Silicon Processing for the VLSI Era, vol. 1: Process Technology, Lattice Press, 1986, pp. 191–195.*

* cited by examiner

Primary Examiner—William M. Brewster
(74) Attorney, Agent, or Firm—Foley & Lardner LLP

(57) ABSTRACT

Patterning of a gate line is terminated prior to etching completely through the conductive layer from which it is patterned. Surfaces of the conductive layer are then reacted in a reactive atmosphere, and the reacted surfaces are removed, creating a narrow gate line. The protection provided by the remaining portion of the conductive layer during reaction protects the lower corners of the patterned feature from undercutting growth of reacted material. Alternatively, a gate line is patterned from a multi-layered conductive structure that includes a lower conductive layer and an upper conductive layer that exhibits higher reactivity in a reactive atmosphere than the lower layer. The upper layer is patterned and then the structure is reacted in the reactive atmosphere. Reacted portions of the upper layer are then removed and the lower layer is patterned in a self-aligned manner to complete the formation of a gate line and gate insulator.

5 Claims, 7 Drawing Sheets

METHOD FOR PATTERNING NARROW GATE LINES

BACKGROUND OF THE INVENTION

1. Field of the Invention

Embodiments of the present invention relate to semiconductor fabrication, and in particular, to patterning of narrow device features such as gate lines.

2. Background Technology

The emphasis on increased semiconductor device performance has led to investigation of ways to increase device speed. One way of increasing device speed is to reduce the size of individual circuit components and the wiring that connects them. This enables circuit components to operate faster and to be placed closer together, and enables more circuit components to be used in a given device.

The reduction of MOSFET gate line width is particularly important since this dimension is closely tied to switching speed and operating voltage. However, MOSFET gate lines patterned using only traditional projection lithography techniques are limited by the minimum feature size that can be patterned in a photoresist mask. Accordingly, supplemental techniques for further reducing gate line widths have been developed One such technique involves oxidizing the gate line sidewalls to reduce gate line width. FIGS. 1a–1c show structures formed during such processing. As shown in FIG. 1a, a polysilicon gate line 14 is formed on a silicon oxide gate insulating layer 12 that overlies a semiconductor substrate 10. The polysilicon gate line is patterned using a hardmask 16. FIG. 1b shows the structure of FIG. 1 a after the structure has been reacted in an oxidizing atmosphere such as an oxygen plasma to create oxidized sidewall portions 18 on the gate line 14. FIG. 1c shows the structure of FIG. 1b after stripping of the hardmask and the oxidized sidewall portions. The resulting polysilicon gate line 14 is significantly narrower after this processing. However, as seen in FIG. 1b, the oxidizing atmosphere has a pronounced effect at the corners of the polysilicon gate line near their junction with the underlying gate oxide layer 12. This effect is produced by the diffusion of oxygen through the oxide layer 12 toward the polysilicon gate line 14. The result is an undercutting oxide growth 20 around the edges of the gate line 14 at its junction with the underlying gate insulating layer 12. The undercutting portion 20 of the oxide remains in the final gate structure as seen in FIG. 1c, resulting in degraded short channel control and thus degraded device performance.

Consequently, there is a need for further techniques for providing further narrowing of semiconductor device dimensions and reductions in gate widths.

SUMMARY OF THE INVENTION

It is an object of the present invention to provide a method and apparatus for defining narrow semiconductor device geometries. It is a further object of the present invention to provide a method for reducing the width of MOSFET gate lines.

In accordance with one embodiment of the invention, patterning of a gate line is terminated prior to etching completely through the conductive layer from which it is patterned. Surfaces of the conductive layer are then reacted in a reactive atmosphere, and at least a portion of the reacted surfaces are removed, creating a narrow gate line. The protection provided by the remaining portion of the conductive layer during reaction protects the lower corners of the gate line from undercutting growth of reacted material.

In accordance with another embodiment of the invention, a gate line is patterned from a multi-layered conductive structure that includes a lower conductive layer and an upper conductive layer that exhibits higher reactivity in a reactive atmosphere than the lower layer. The upper layer is patterned and then the structure is reacted in the reactive atmosphere. Reacted portions of the upper layer are then removed and the lower layer is patterned in a self-aligned manner to complete the formation of a gate line.

DESCRIPTION OF THE DRAWINGS

Preferred embodiments of the invention will hereafter be described with reference to the accompanying drawings, wherein like numerals denote like elements, and in which.

DETAILED DESCRIPTION OF PREFERRED EMBODIMENTS

Figure 2A:
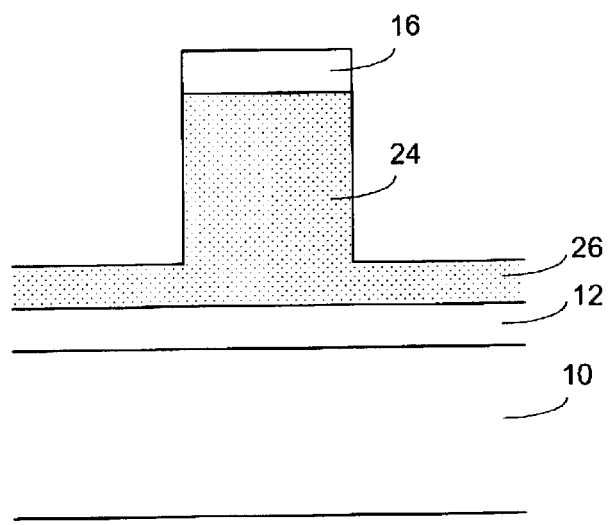
FIGS. 2a, 2b, 2c and 2d show structures formed during patterning of a gate line in accordance with a first preferred embodiment and an alternative to the first embodiment.
Figure 2B:
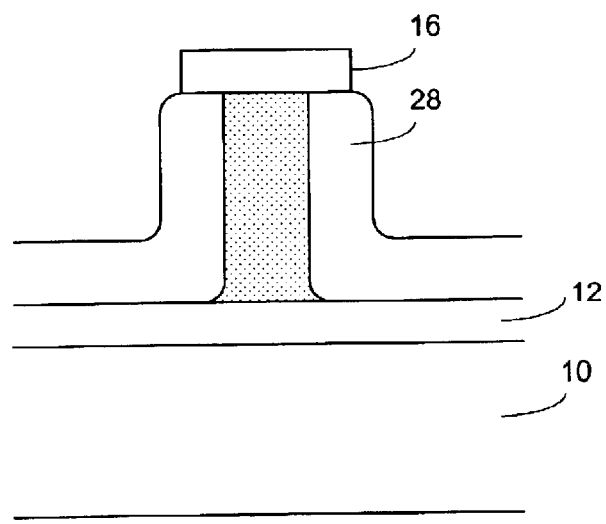
Figure 2C:
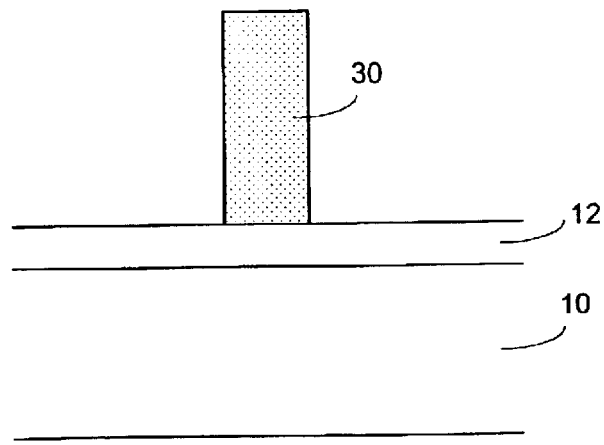

FIGS. 2a–2c show structures formed during processing in accordance with a first preferred embodiment. As shown in FIG. 2a, a gate line is partially patterned from a polysilicon conductive layer using a silicon nitride hardmask 16. Patterning of the conductive layer is terminated prior to patterning of the entire thickness of the conductive layer. This produces an upper patterned portion 24 and a lower unpatterned portion 26. The polysilicon material may be patterned using a plasma comprising HBr, $Cl_2$, He, $O_2$ and $CF_4$.

FIG. 2b shows the structure of FIG. 2a after reaction in a reactive atmosphere such as an oxygen atmosphere for example in a furnace having an atmosphere containing oxygen and argon at a temperature of 800 to 900 degrees C. Exposure to the reactive atmosphere forms a reacted surface 28 on the upper patterned portion 24 of the polysilicon conductive layer and the lower unpatterned portion of the polysilicon conductive layer. Exposure is continued until the entire thickness of the lower unpatterned portion is reacted. Accordingly, the selection of the thickness of the unpatterned portion is determinative of the amount of the upper patterned portion that will be reacted to narrow the width of the gate line. As seen in FIG. 2b, the lower unpatterned portion of the polysilicon conductive layer provides protection to the areas that will form the lower corners of the gate line, thus preventing the undercutting by reacted material that is characteristic of the conventional method.

Figure 1A:
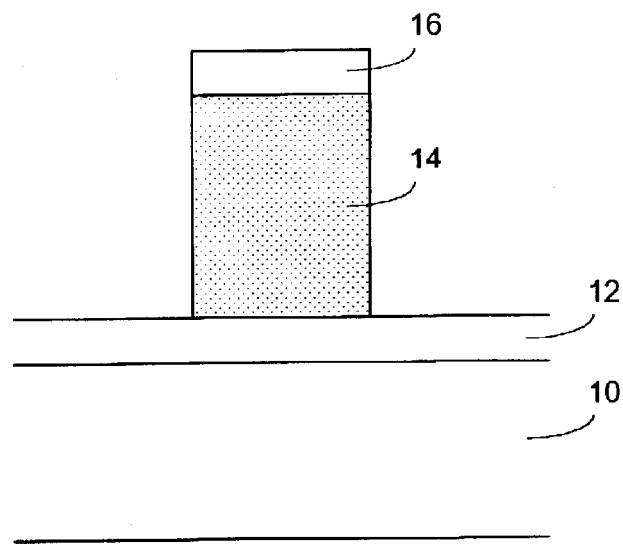
FIGS. 1a, 1b and 1c show structures formed during patterning of a gate line in accordance with a conventional method.
Figure 1B:
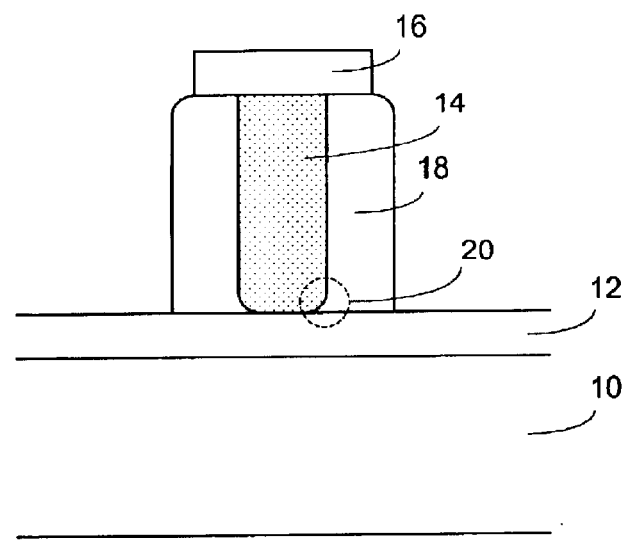
Figure 1C:
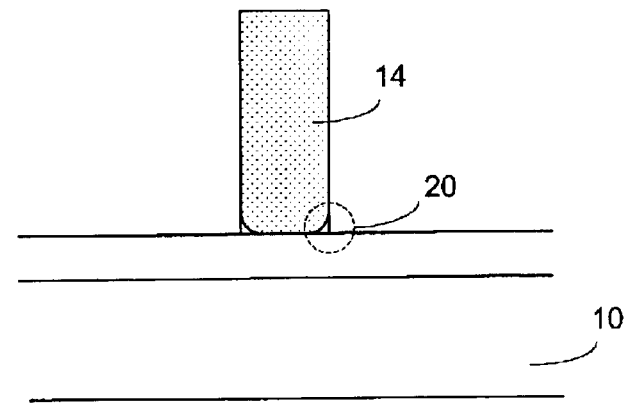

FIG. 2c shows the structure of FIG. 2b after removal of the hardmask and the reacted surfaces to leave a narrow gate line 30. The silicon nitride hardmask 16 may be removed in a wet etch using hot phosphoric acid. The reacted oxide surfaces 28 may be removed using a wet etch in HF, or a dry etch in a plasma of argon and $C_4F_8$. Unlike the conventional structure of FIG. 1c, the structure of FIG. 2c has a relatively uniform insulator thickness beneath the gate.

Figure 2D:
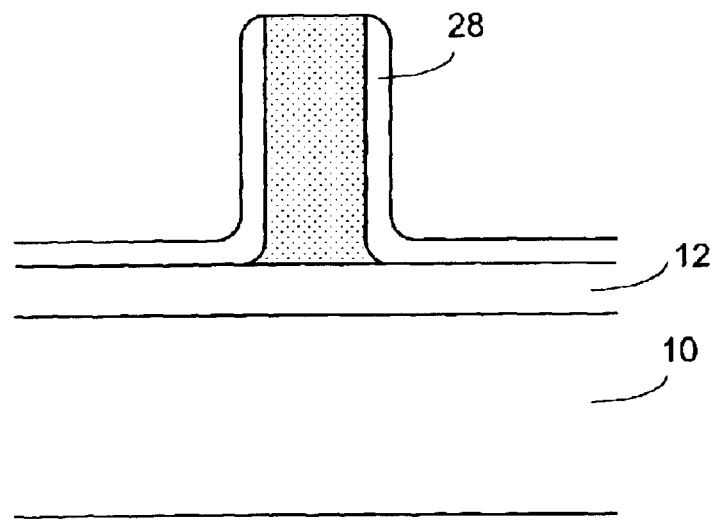

While the processing shown in FIGS. 2a–2c is presently preferred, a variety of alternatives may be implemented. FIG. 2d shows an alternative structure formed after formation of FIG. 2b. The structure of FIG. 2d shows the structure of FIG. 2b after being subjected to a wet etch for a period of time sufficient to remove a portion of the thickness of the reacted oxide layer 28. The remaining portion of the oxide layer may be retained to serve as a protective oxide layer on the gate and as an offset spacer for masking during implantation of shallow source and drain regions. In addition to the alternative of FIG. 2d, different hardmask materials, conductive materials, and gate insulating materials may be employed. Further, the reaction of the conductive material need not be performed using an oxidizing atmosphere, but may instead produce a different type of reaction. In addition, it may be desirable to pattern the initial patterned portion of the polysilicon layer so as to be narrower at its bottom than at its top, to thereby compensate for the protrusion of any protruding portions at the bottom of the polysilicon gate after reaction.

Figure 3:
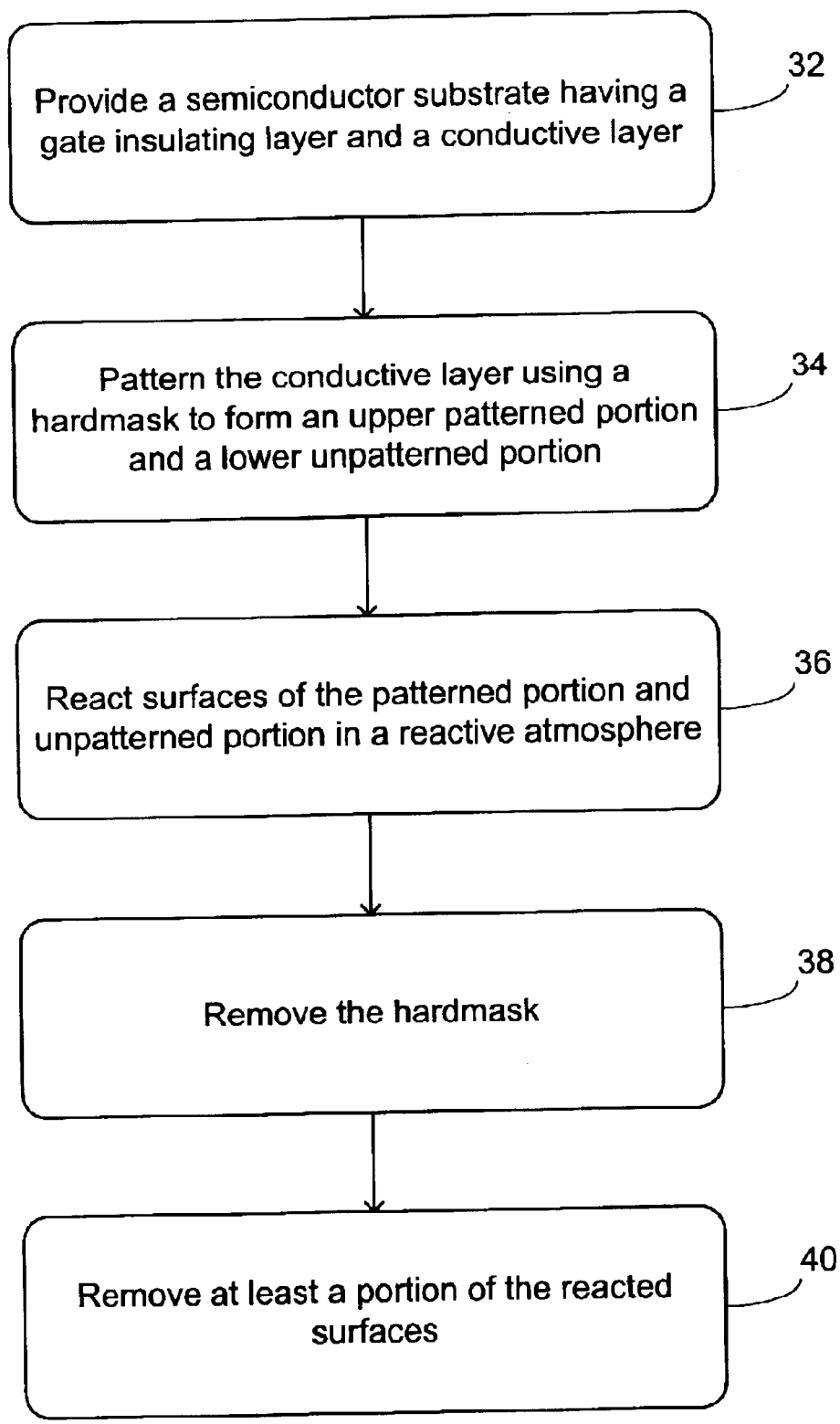
FIG. 3 shows a process flow encompassing the first preferred embodiment and alternative embodiments.

A process flow encompassing the first preferred embodiment, the aforementioned alternatives and other alternatives is shown in FIG. 3. Initially a semiconductor substrate is provided (32). A gate insulating layer is formed on the semiconductor substrate and a conductive layer is formed on the gate insulating layer. The conductive layer is then patterned using a hardmask to form an upper patterned portion and a lower unpatterned portion (34). Surfaces of the conductive layer are then reacted in a reactive atmosphere (36). The hardmask is then removed (38). In some implementations, at least a portion of the reacted surfaces of the conductive layer may be removed (40). Further MOSFET fabrication processing may then be performed, such as implantation of shallow source and drain extensions, spacer formation, implantation of deep source and drain regions, and formation of suicides.

Figure 4A:
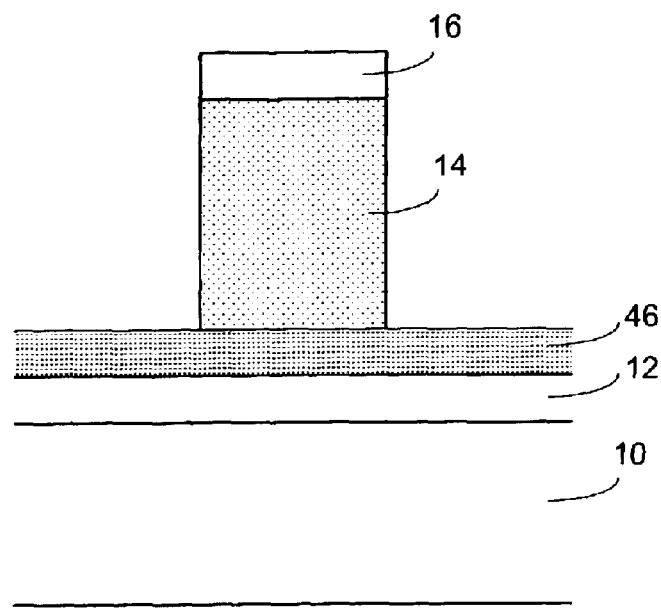
FIGS. 4a, 4b, 4c and 4d show structures formed during patterning of a gate line in accordance with a second preferred embodiment.

FIGS. 4a–4d show structures formed during processing in accordance with a second preferred embodiment. As shown in FIG. 4a, a semiconductor substrate 10 has a silicon oxide gate insulating layer 12 formed thereupon. A lower TaN conductive layer 46 is formed on the gate insulating layer 12, and an upper polysilicon conductive layer is patterned using a silicon nitride hardmask 16 to form an upper gate line portion 14. The material of the lower conductive layer 46 is chosen to have an appropriate work function for serving as part of the gate line, to be substantially less reactive than the material of the upper conductive layer or essentially inert in a reactive atmosphere, and to have good etch selectivity with respect to the upper conductive layer.

Figure 4B:
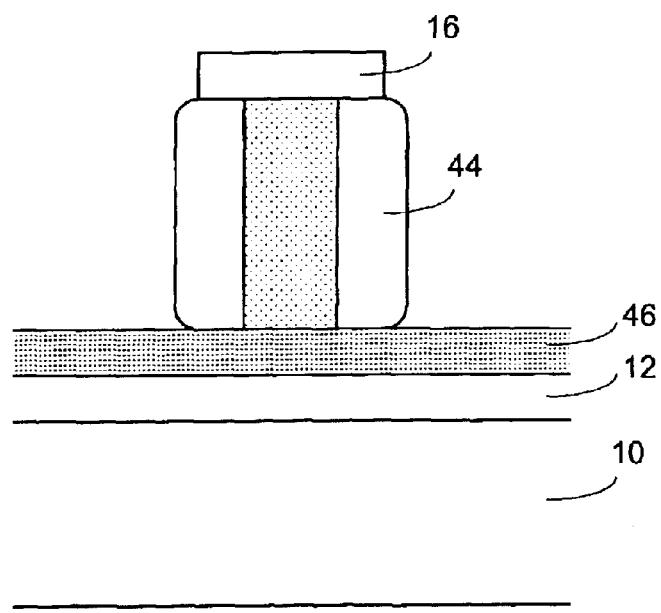

FIG. 4b shows the structure of FIG. 4a after exposure to a reactive atmosphere such as an oxygen atmosphere. Exposure to the reactive atmosphere forms reacted sidewalls 44 on the upper gate line portion 14. Parameters such as temperature and reaction time may be chosen so as to consume a desired amount of the conductive material. As seen in FIG. 4b, because the second conductive layer 46 is relatively inert in the reactive atmosphere, no undercutting of reacted material occurs at the junction of the upper gate line portion 14 and the lower conductive layer 46. Further, the junction of the lower conductive layer 46 and the gate insulating layer 12 is protected from reaction, and so the material at that junction is unaffected by the reaction process.

Figure 4C:
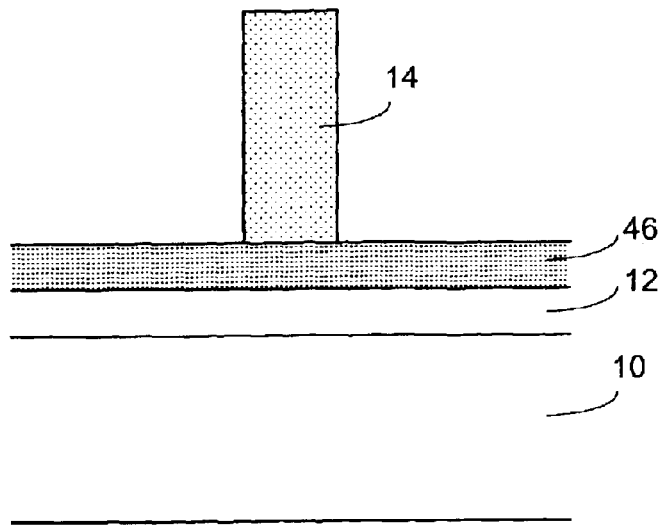

FIG. 4c shows the structure of FIG. 4b after removing the hardmask followed by removing the reacted sidewalls from the upper gate line portion 14. This leaves an upper gate line portion 14 that is significantly narrower than its original patterned form.

Figure 4D:
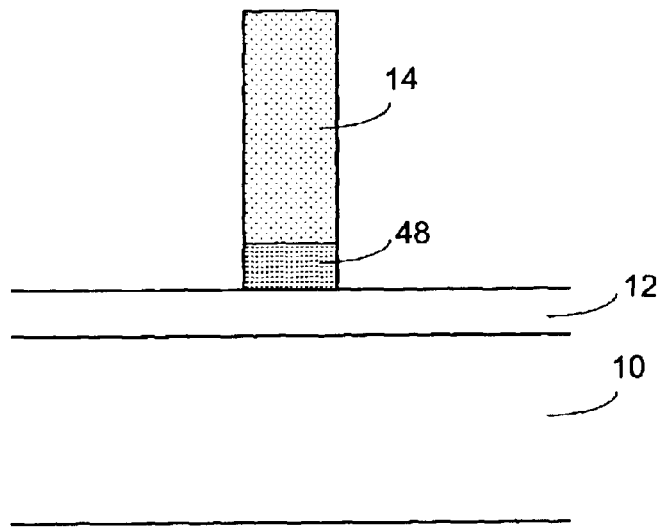

FIG. 4d shows the structure of FIG. 4c after patterning of the lower conductive layer to form a self-aligned lower gate line portion 48. As seen in FIG. 4d, the width of the interface between the lower gate line portion 48 and the gate insulating layer 12 is unaffected by the reaction process.

While the processing shown in FIGS. 4a–4d is presently preferred, a variety of alternatives may be implemented. For example, different hardmask materials, conductive materials, and gate insulating materials may be employed. Further, the reaction of the conductive material need not be performed using an oxidizing atmosphere, but may instead produce a different type of reaction.

Figure 5:
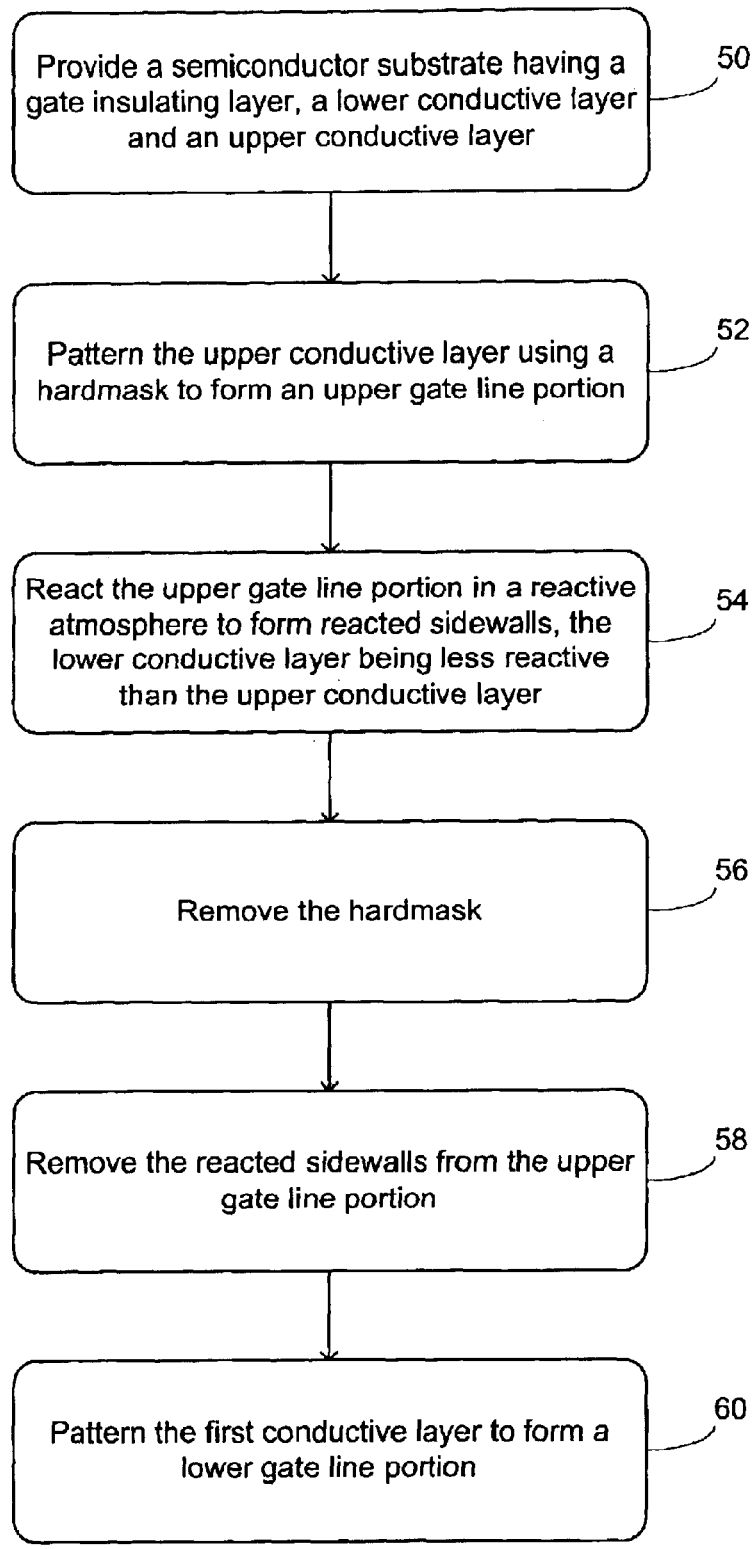
FIG. 5 shows a process flow encompassing the second preferred embodiment and alternative embodiments.

A process flow encompassing the second preferred embodiment, the aforementioned alternatives and other alternatives is shown in FIG. 5. Initially a semiconductor substrate is provided (50). The substrate has formed thereon a gate insulating layer, a lower conductive layer formed on the gate insulating layer, and an upper conductive layer formed on the lower conductive layer. The upper conductive layer is then patterned using a hardmask to form an upper gate line portion (52). The upper gate line portion is then reacted in a reactive atmosphere to form reacted sidewalls on the upper gate line portion (54). The lower conductive material and the reactive atmosphere are chosen such that the lower conductive layer is less reactive in the reactive atmosphere than the upper conductive layer. The hardmask is then removed (56), and the reacted sidewalls are removed from the upper gate line portion (58). The lower conductive layer is then patterned to form a self-aligned lower gate line portion (60). Further MOSFET fabrication processing may then be performed, such as implantation of shallow source and drain extensions, spacer formation, implantation of deep source and drain regions, and formation of silicides.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counterdoping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for forming a semiconductor device comprising:

provide a semiconductor substrate having a gate insulating layer formed on the substrate, a lower conductive layer formed on the gate insulating layer, and an upper conductive layer formed on the lower conductive layer;

patterning the upper conductive layer using a hardmask to form an upper gate line portion;

reacting the upper gate line portion in a reactive atmosphere to form reacted sidewalls on the upper gate line portion, wherein the lower conductive layer is less reactive in the reactive atmosphere than the upper gate line portion;

removing the hardmask;

removing the reacted sidewalls from the upper gate line portion;

patterning the lower conductive layer to form a lower gate line portion that is self-aligned with the upper gate line portion.

2. The method claimed in claim 1, wherein the lower conductive layer is TaN.

3. The method claimed in claim 1, wherein the hardmask is silicon nitride.

4. The method claimed in claim 1, wherein the gate insulating layer is silicon oxide, wherein the upper conductive layer is polysilicon, and wherein reacting sidewalls of the upper gate line portion comprises oxidizing the sidewalls of the upper gate line portion.

5. The method claimed in claim 1, wherein reacting sidewalls of the upper gate line portion comprises silicidation of the sidewalls of the upper gate line portion.

* * * * *